US009917562B2

(12) United States Patent
Krishnaswamy et al.

(10) Patent No.: US 9,917,562 B2
(45) Date of Patent: Mar. 13, 2018

(54) SYSTEMS AND METHODS FOR ADJUSTING AUTOMATIC GAIN CONTROL (71) Applicant: Apple Inc., Cupertino, CA (US)

(72) Inventors: Arvindh Krishnaswamy, San Jose, CA (US); Juha O. Merimaa, Redwood City, CA (US); Kapil Krishnamurthy, Santa Clara, CA (US); Yuchao Song, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/175,970

(22) Filed: Jun. 7, 2016

(65) Prior Publication Data

US 2016/0294343 A1 Oct. 6, 2016

Related U.S. Application Data (62) Division of application No. 13/800,487, filed on Mar. 13, 2013, now Pat. No. 9,401,685.

(60) Provisional application No. 61/679,259, filed on Aug. 3, 2012, provisional application No. 61/657,302, filed on Jun. 8, 2012.

(51) Int. Cl.
*H03G 3/30* (2006.01)
*H03G 3/20* (2006.01)

(52) U.S. Cl.
CPC ............. *H03G 3/3005* (2013.01); *H03G 3/20* (2013.01); *H03G 3/3089* (2013.01)

(58) Field of Classification Search
CPC ....... H03G 3/3005; H03G 3/20; H03G 3/3089
USPC ................................................. 381/104, 107
See application file for complete search history.

(56) References Cited

U.S. PATENT DOCUMENTS

| | | | |
|---|---|---|---|
| 5,016,205 A | 5/1991 | Shumway | |
| 5,146,504 A | 9/1992 | Pinckley | |
| 5,854,845 A * | 12/1998 | Itani | H03G 3/001 381/104 |
| 6,351,529 B1 * | 2/2002 | Holeva | H03G 3/3089 379/347 |
| 6,433,633 B1 | 8/2002 | Hellum et al. | |
| 7,155,385 B2 | 12/2006 | Berestesky | |
| 7,190,292 B2 * | 3/2007 | Bizjak | H03G 3/32 341/110 |
| 7,283,879 B2 | 10/2007 | Zeevi et al. | |
| 8,208,659 B2 | 6/2012 | Chalil | |
| 2002/0085725 A1 * | 7/2002 | Bizjak | H03G 3/3089 381/106 |
| 2009/0252347 A1 | 10/2009 | Kakkeri et al. | |
| 2010/0128904 A1 * | 5/2010 | Hanna | H03G 3/3005 381/107 |
| 2010/0142729 A1 | 6/2010 | Noguchi | |

(Continued)

*Primary Examiner* — David Ton
(74) *Attorney, Agent, or Firm* — Womble Bond Dickinson (US) LLP (57) ABSTRACT Automatic gain control systems disclosed herein can incorporate a confidence metric that can estimate the accuracy of gain adjustments calculated by an automatic gain control module. The confidence metric may be based on a percentage of valid audio samples in a given period of time. Based on the confidence metric, the AGC response may be reduced, delayed, frozen, or otherwise altered from the baseline gain adjustment. Time-averaging process may be used to estimate the input signal power level and determine an appropriate baseline gain adjustment. Additionally, weighting functions can be adjusted to prevent overestimation of the signal power.

12 Claims, 6 Drawing Sheets

(56) References Cited

U.S. PATENT DOCUMENTS

| | | |
|---|---|---|
| 2010/0189270 A1 | 7/2010 | Noguchi |
| 2011/0176693 A1 | 7/2011 | O'Connell et al. |
| 2012/0250895 A1* | 10/2012 | Katsianos .............. H03G 9/005 381/107 |
| 2013/0329912 A1* | 12/2013 | Krishnaswamy ........ H03G 3/20 381/107 |

* cited by examiner

SYSTEMS AND METHODS FOR ADJUSTING AUTOMATIC GAIN CONTROL

CROSS REFERENCE TO RELATED APPLICATIONS

This application is a divisional of co-pending U.S. application Ser. No. 13/800,487 filed Mar. 13, 2013, which claims the benefit of U.S. Provisional Patent Application No. 61/657,302, filed Jun. 8, 2012, and U.S. Provisional Patent Application No. 61/679,259, filed Aug. 3, 2012, both of which are hereby incorporated by reference herein in their entireties.

BACKGROUND

Automatic gain control ("AGC") is used in many audio systems to adjust gain to an appropriate level for a given input signal. However, typical AGC systems may be incapable of providing optimal gain control for voice signals that include periods of speech and silence that can vary from speaker to speaker. In particular, relatively high proportions of silence to speech in a given input signal can result in poor feedback to the AGC system and, therefore, poorly controlled signal output.

SUMMARY OF THE DISCLOSURE

Systems and methods for adjusting automatic gain control are disclosed. A baseline gain adjustment may be calculated and provided to an AGC module based on, for example, a moving average of the RMS energy of an input signal. The AGC systems disclosed herein may also incorporate a confidence metric that can estimate the accuracy of gain control data calculated by an AGC module. The confidence metric may be based on, for example, a percentage of valid audio samples in a given period of time. Based on the confidence metric, the AGC response may be reduced, delayed, frozen, or otherwise altered from the baseline gain adjustment.

Additionally, weighting functions, which may be used to determine the RMS energy and the confidence metric, may be adjusted to prevent overestimation of the signal power. For example, in response to a large peak in the input signal power, the weighting function may be adjusted to slow down the averaging of consecutive audio samples.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

The energy levels of raw audio input signals may vary for any number of reasons, including from microphone placement, microphone gain, and the volume and cadence of the particular input signal. In order to ensure that the input signal is reproduced faithfully, AGC may be employed. AGC can refer generally to any signal processing method that adjusts the gain of an output signal based upon characteristics, typically the average power, of the signal. For example, if the distance between a speaker and a microphone capturing the speech varies, the average power of the microphone input signal may also vary accordingly. Using AGC, the gain for the output signal may be increased for weaker signals (e.g., when the speaker is far from the microphone) and decreased for stronger signals (e.g., when the speaker is close to the microphone), thus producing an appropriate output level.

Basing the AGC response solely upon the average power of the input signal may have some drawbacks, however. For instance, if the input signal includes periods of silence, as is the case for human speech, the average power of the input signal may provide a poor representation of the signal power level that truly matters: the average power of the sound excluding the silent portions.

Figure 1:
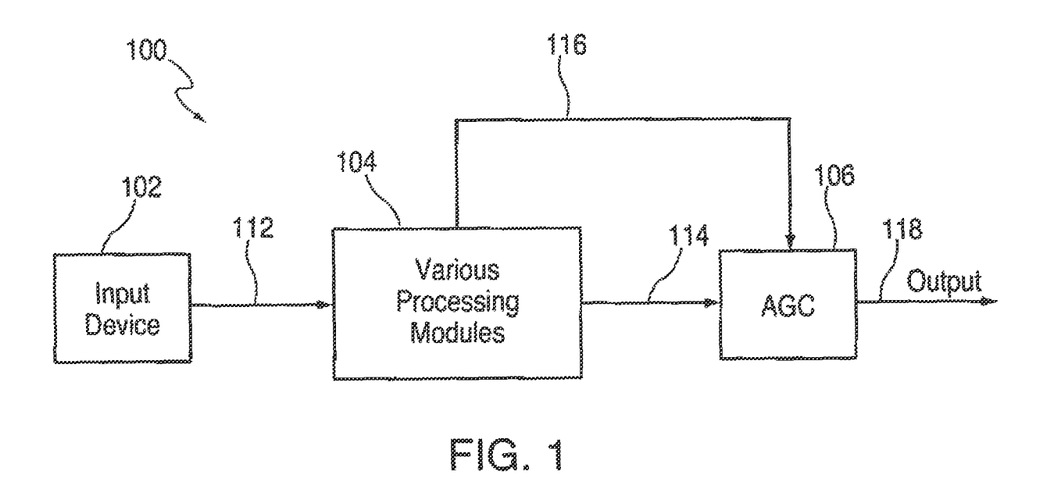
FIG. 1 shows an schematic view of a system for adjusting automatic gain control accordance with various embodiments.

FIG. 1 shows a schematic view of a system 100 for adjusting AGC in accordance with some embodiments. System 100 may include input device 102, audio processing module 104, and AGC module 106. Additionally, system 100 may be configured to transmit signals via a number of communications channels. For example, input signals may be communicated over input signal channel 112, processed signals may be communicated over processed signal channel 114, automatic gain control signals (e.g., confidence metrics) may be communicated over AGC signal channel 116, and output signals may be communicated over output signal channel 118.

Input device 102 can be any device capable of transmitting an audio signal. For example, input device 102 may be a device that is capable of transducing external sounds (i.e., sounds from an external environment) into an electrical signal (e.g., a microphone). One skilled in the art will appreciate that microphones and similar devices may be a component of another device (e.g., a telephone, a tape recorder, and/or a radio transmitter). Further, input device 102 may be a device capable of generating and/or transmitting sounds recorded in any format (e.g., a phonograph record, a compact disc, or an mp3 file).

Regardless of the source of the sound, input device 102 can transmit an input signal to audio processing module 104 over input signal channel 112. Audio processing module 104 may include any number of analog or digital audio processing modules for altering audio signals received over input signal channel 112. Non-limiting examples of such audio processing modules may include pre-amplifiers, filters, equalizers, noise cancellers, etc.

Additionally, audio processing module 104 may include an audio processing module for determining confidence metrics to be passed on to AGC module 106. "Confidence metrics" may refer to signals or variables that can describe the level of confidence that may be ascribed to AGC adjustments to be calculated for a particular "block" of an audio signal. As used herein, a block can refer to a finite portion (e.g., 10-20 ms) of an audio signal. In general, an audio signal with a large proportion of "gaps," or periods of silence, may be rated at a lower confidence metric than an audio signal without any gaps (e.g., a pure tone). Confidence metrics may be calculated in any suitable way, as described in more detail below with respect to FIG. 2; however, a key aspect of calculating confidence metrics may include the proportion of "valid" samples in a block of an audio signal. That is, blocks of an audio signal with more valid data may have a higher confidence level than blocks of an audio signal with less valid data.

Confidence metrics determined in audio processing module 104 may be communicated to AGC module 106 over AGC signal channel 116. Additionally, input audio signals processed in audio processing module 104 may be communicated to AGC module 106 over processed signal channel 114. Although AGC signal channel 116 and processed signal channel 114 are depicted as two separate communications channels in FIG. 1, in some embodiments automatic gain control signals and processed signals may be communicated over a single communications channel.

AGC module 106 may be capable of performing automatic gain control for an incoming audio signal (e.g., a processed signal received from audio processing module 104). Exercising control over the gain of an audio signal can help to adjust for variability in the power of the input signal, and especially relatively long-term variations arising from, for example, the position of a speaker with respect to a microphone capturing that speaker's voice, the loudness of a particular speaker's voice, etc. Thus, AGC module 106 can, in general, increase the gain for weak signals and decrease the gain for strong signals in order to produce an appropriate power level for the output signal.

According to some embodiments, AGC module 106 may perform automatic gain control by calculating the RMS energy of an incoming audio signal (e.g., a processed signal received over processed signal channel 114) as a function of a weighting function. A "weighting function" can be any suitable function for actively averaging an incoming audio signal. Weighting functions will be discussed in detail below with respect to FIG. 2.

According to some embodiments, AGC module 106 may incorporate confidence metrics received from audio processing module 104 to produce a more reliable and robust output signal. In particular, AGC module 106 can examine a confidence metric associated with an input signal when determining whether and/or how to implement automatic gain control for that block. For example, if the confidence factor for a block of audio data is low (e.g., there was a low proportion of valid audio samples in the block) AGC module 106 may reduce, delay, or cancel the calculated "baseline" automatic gain control response. On the other hand, if the confidence factor for a block of audio data is high (e.g., there was a high proportion of valid audio samples in the block) AGC module 106 may implement the full baseline automatic gain control response.

Figure 2:
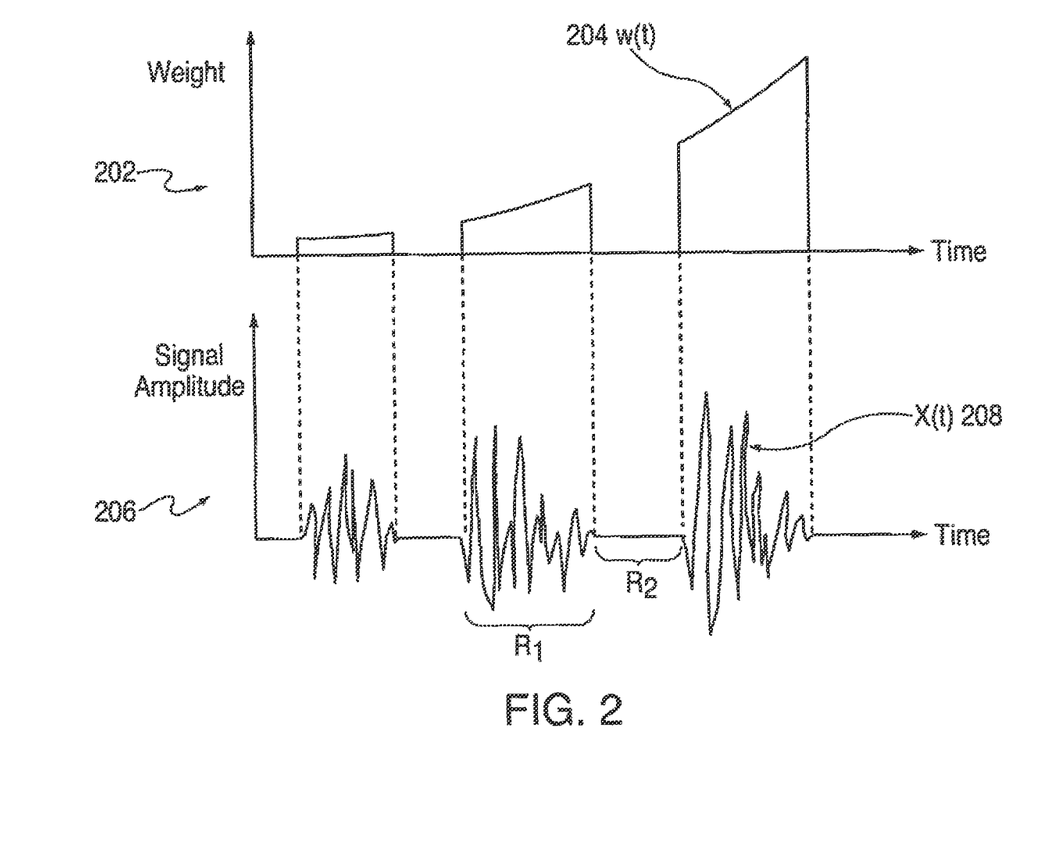
FIG. 2 shows illustrative graphs of a weighting function applied to an input audio signal in accordance with various embodiments.

FIG. 2 shows illustrative graphs 202 and 206 of a weighting function 204 applied to an input audio signal 208, respectively, in accordance with various embodiments. As depicted in FIG. 2, weighting function 204, or w(t), is an exponential function that spans a finite period of time. Exponential functions are particularly well suited as weighting functions for AGC because they give a relatively high weight to more recent portions of a signal while also taking into account the recent history of the signal; however, the weighting function may be any suitable function (e.g., a linear, parabolic, or hyperbolic function). The calculation for the root-mean-square value of the energy of an input signal (e.g., input audio signal 208) may then be described as:

$$\text{RMS energy} = \sqrt{\frac{\sum_t w(t) x^2(t)}{\sum_t w(t)}} \quad (1)$$

According to the input signal energy calculated in Eq. (1), an AGC module (e.g., AGC module 106 of FIG. 1) can adjust the gain of the input signal accordingly. That is, for high RMS energy values, the AGC can reduce the gain, and for low RMS energy values, the AGC can increase the gain. In order to process an ongoing audio signal, weighting function 204 can be slid to the right as compared with input signal 208 such that the leading (highest) edge of the weighting function is applied to the most recent portion of the input signal. This gain control may be subject to further adjustment, however, as described in detail below with respect to FIG. 3.

As depicted in FIG. 2, weighting function 204 may not be a continuous exponential function. Instead, it can include intervals during which the function drops to zero. Those intervals can correspond to gaps, or stretches of silence (or background noise) in input signal 208. Thus, over interval $R_1$, which can correspond to an interval of activity (i.e., valid data), weighting function 204 can be non-zero. On the other hand, over interval $R_2$, which can correspond to a stretch of silence, or invalid data, weighting function 204 can be reduced to zero, thus not including periods of silence in the overall RMS energy calculation.

A system for adjusting AGC can recognize such gaps using any suitable method including, for example, comparing an average energy calculated for the signal against one or more baseline energy values. In some embodiments, gaps may be recognized using a level-based activity detector in an audio processing module (e.g., audio processing module 104 of FIG. 1).

Figure 3:
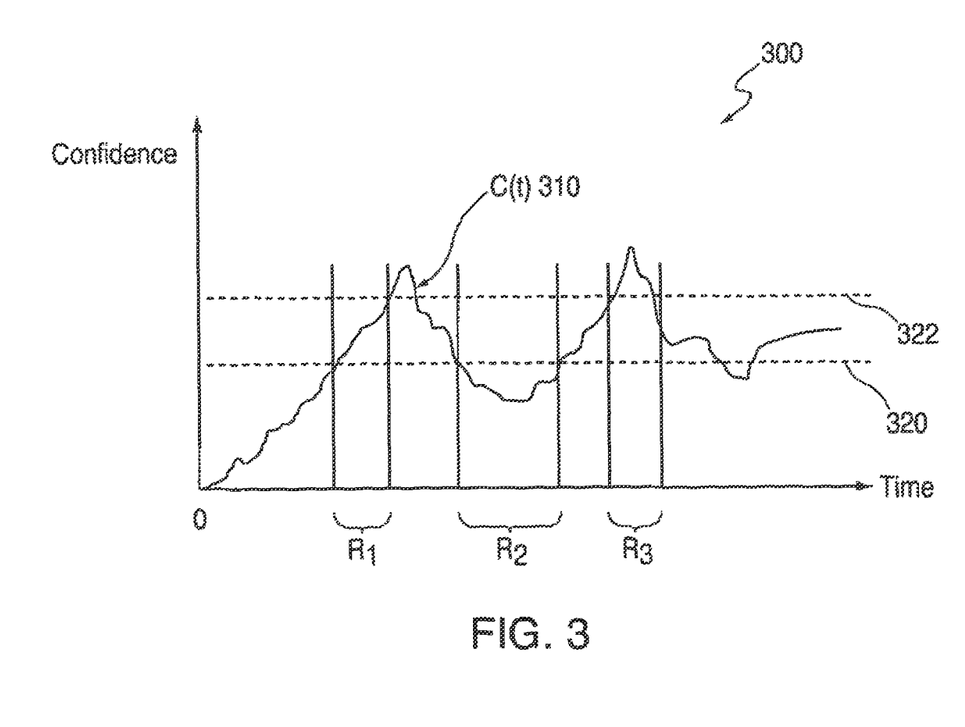
FIG. 3 shows an illustrative graph of a confidence metric for adjusting automatic gain control in accordance with various embodiments.

FIG. 3 shows an illustrative graph 300 of a confidence metric 310 for adjusting automatic gain control in accordance with some embodiments. Graph 300 may include confidence thresholds 320 and 322 for determining adjustments to a baseline AGC response.

Confidence metric 310 can represent, over time, the confidence that an AGC module (e.g., AGC module 106 of FIG. 1) will correctly adjust the gain of a given input signal. Because an AGC module may require valid signal data in order to make proper gain adjustments, signals with high proportions of invalid data (e.g., silence or background noise on an audio signal) may result in the AGC module making improper gain adjustments. Thus, confidence metric 310 can track the input signal and determine whether the AGC module is likely to make a proper gain adjustment. Confidence metric 310 can represent, for example, a moving average of individual confidence factors calculated for an input signal. The calculation for the confidence factor for a chunk of an input signal (e.g., input audio signal 208 of FIG. 2) may be described as:

$$\text{Confidence factor} = \frac{\sum_t w(t)}{w_{full}} \quad (2)$$

where $w_{full}$ can be the sum over the weight function $w(t)$ without any gaps. For example, a pure tone without any gaps would have a confidence factor equal to 1, while a silent input signal would have a confidence factor equal to 0.

According to some embodiments, confidence metric 310 can be calculated recursively. That is, rather than using a weighting function spanning a finite period of time, an infinitely long weighting function may be used to average the input signal. In such embodiments, the confidence metric may be defined alternately as:

$C(t)=\alpha C(t-1)+(1-\alpha)$, if the data is valid and $C(t)=\alpha C(t-1)$, if the data is invalid. (3)

where $\alpha$ can be a coefficient that represents the responsiveness of a given weighting function, as described in more detail below with respect to FIG. 4.

An AGC module can receive confidence metric 310 in coordination with an accompanying input signal for adjusting AGC of the input signal. Confidence metric 310 may be used by the AGC to determine how and/or whether to implement calculated baseline AGC adjustments. For example, if an AGC module calculates a baseline gain of +2 dB for an input signal, but the confidence metric is low, the AGC module may choose not to implement that gain adjustment, to implement the gain adjustment slowly, or to implement a fraction of the gain adjustment (e.g., +1 dB). On the other hand, if the confidence metric is high, the AGC module may choose to implement the full +2 dB gain adjustment.

According to some embodiments, an AGC module may implement AGC adjustments based on comparing a confidence metric (e.g., confidence metric 310) to a number of confidence thresholds. As depicted in FIG. 3, low confidence threshold 320 and high confidence threshold 330 may assist an AGC module in making a determination regarding how to implement a gain adjustment. For example, if confidence metric 310 dips below low confidence threshold 320, the AGC module may determine that no gain adjustments should be made. Thus, in interval $R_2$, during which confidence metric 310 is below low confidence threshold 320, the AGC module may choose to forgo any gain adjustments.

If, however, confidence metric 310 falls above low confidence threshold 320, but below high confidence threshold 330, the AGC module may partially implement a baseline gain adjustment. For example, the AGC module may adjust the gain slowly or implement only a fraction of the baseline gain adjustment. Thus, in interval $R_1$, during which confidence metric 310 is between low confidence threshold 320 and high confidence threshold 330, the AGC module may partially implement the baseline gain adjustment.

Further, if confidence metric 310 exceeds high confidence threshold 330, the AGC module may fully implement the baseline gain adjustment. For example, in interval $R_3$, during which confidence metric 310 is above high confidence threshold 330, the AGC module may fully implement the baseline gain adjustment.

In further embodiments, an AGC module may implement gain adjustments as a function of the confidence metric. For example, confidence metric 310 take values between 0 (no confidence) and 1 (perfect confidence). For confidence metric values between 0 and 1, the AGC module may implement the baseline gain adjustment on a sliding scale.

Figure 4:
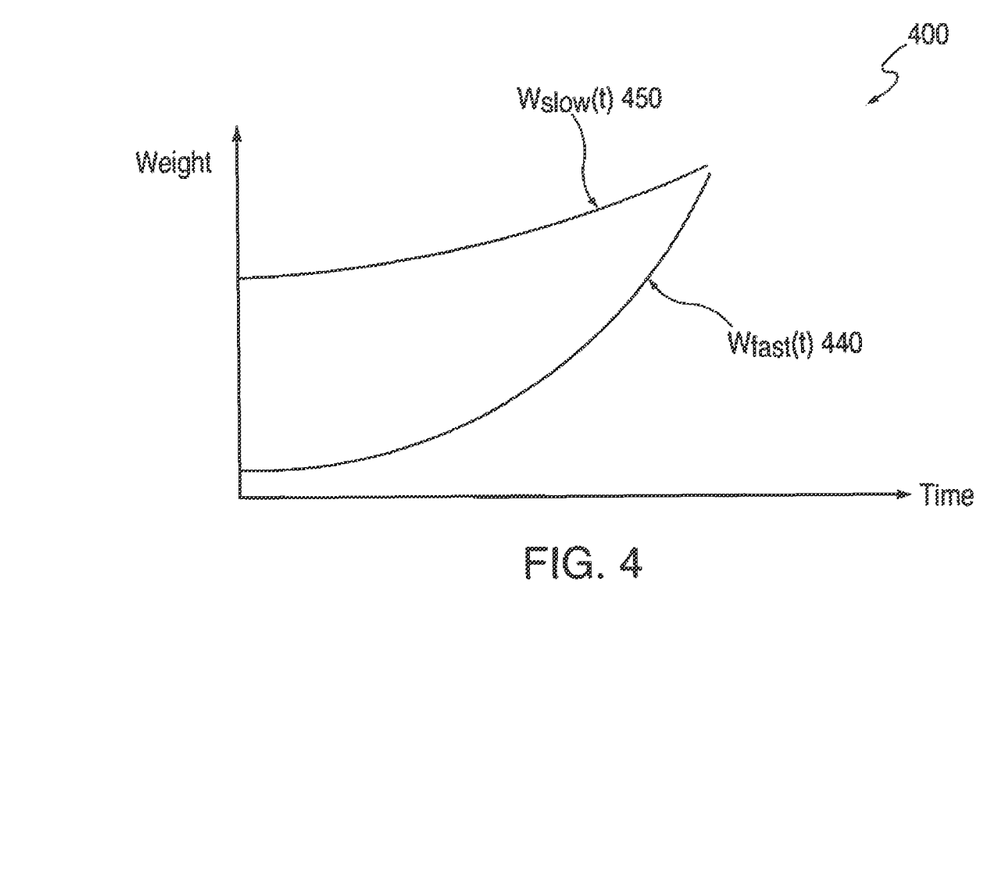
FIG. 4 shows an illustrative graph of two potential weighting functions in accordance with various embodiments.

FIG. 4 shows an illustrative graph 400 of two potential weighting functions 440 and 450 in accordance with various embodiments. In general, weighting functions chosen for AGC can determine the responsiveness of the AGC response. For example, a relatively "flat" weighting function (e.g., weighting function 450) that gives similar weights to recent and past portions of an input signal can result in a slow AGC response. On the other hand, a relatively "steep" weighting function (e.g., weighting function 440) that gives recent portions of an input signal much more weight than past portions can result in a fast AGC response.

According to some embodiments, a system for adjusting AGC can utilize more than one weighting function in order to suppress overestimation of the signal power of an input signal in response to a large peak. Such large peaks may result, for example, from a speaker tapping a microphone, feedback, or any other short-term power peak in an input signal. One way to deal with this problem is to slow down the averaging when there is a sudden increase in the power level of the input signal by using a flat or slow weighting function. Thus, temporary peaks have diminished effect, but sustained high levels are handled properly.

According to some embodiments, two or more weighting functions may be used simultaneously in an AGC system. Thus, in the normal case where the power of an input signal is relatively steady, an AGC module (e.g., AGC module 106 of FIG. 1) can reference the fast weighting function to determine a baseline automatic gain response. However, if the system detects a sudden peak in power of the input signal, the AGC module can switch to a slower weighting function, which can have the result dual benefits of dampening the peak and avoiding overestimation of the average signal power. Once the input signal returns to a relatively steady state, the AGC module can begin to reference one or more faster weighting functions.

Short-term averaged signal power can be estimated as:

$$P(t)=\alpha P(t-1)+(1-\alpha)x^2(t) \quad (4)$$

where $x(t)$ is the input signal and $0 \leq \alpha \leq 1$. In this case, $\alpha$ can be a coefficient that represents the responsiveness of a given weighting function (i.e., whether the weighting function is "fast" or "slow"). Values of $\alpha$ closer to 1 can correspond to slow weighting functions as they give more weight to past data, while values of $\alpha$ closer to 0 can correspond to fast weighting functions as they give more weight to recent data. One possible implementation for peak suppression of an input signal can rely on thresholds to determine the appropriate value of $\alpha$ and, therefore, an appropriate weighting function to use for automatic gain control. Such an implementation may be represented as:

$$\text{if } \frac{x^2(t)}{P(t-1)} > \text{threshold, use } \alpha_{slow} \quad (5)$$

$$\text{else, use } \alpha_{fast}.$$

According to some embodiments, an AGC system may reference any number of thresholds for switching between any number of suitable weighting functions. In further embodiments, a can be set as a function of $$\frac{x^2(t)}{P(t-1)}$$

to tailor the response to transients as desired.

Various time-averaging processes may be used to obtain an estimate of input signal power level in accordance with embodiments of the invention. For example, a linear combination of input signal samples may be used in some embodiments (e.g., simple moving average, weighted moving average, exponentially weighted moving average, or some other modified average) while a nonlinear combination may be used in other embodiments (e.g., moving log average). As described in more detail below, the time-averaging process selected may depend at least in part on characteristics of the input signal (e.g., rise time, fall time, amplitude, variance, and/or signal shape).

Figure 5:
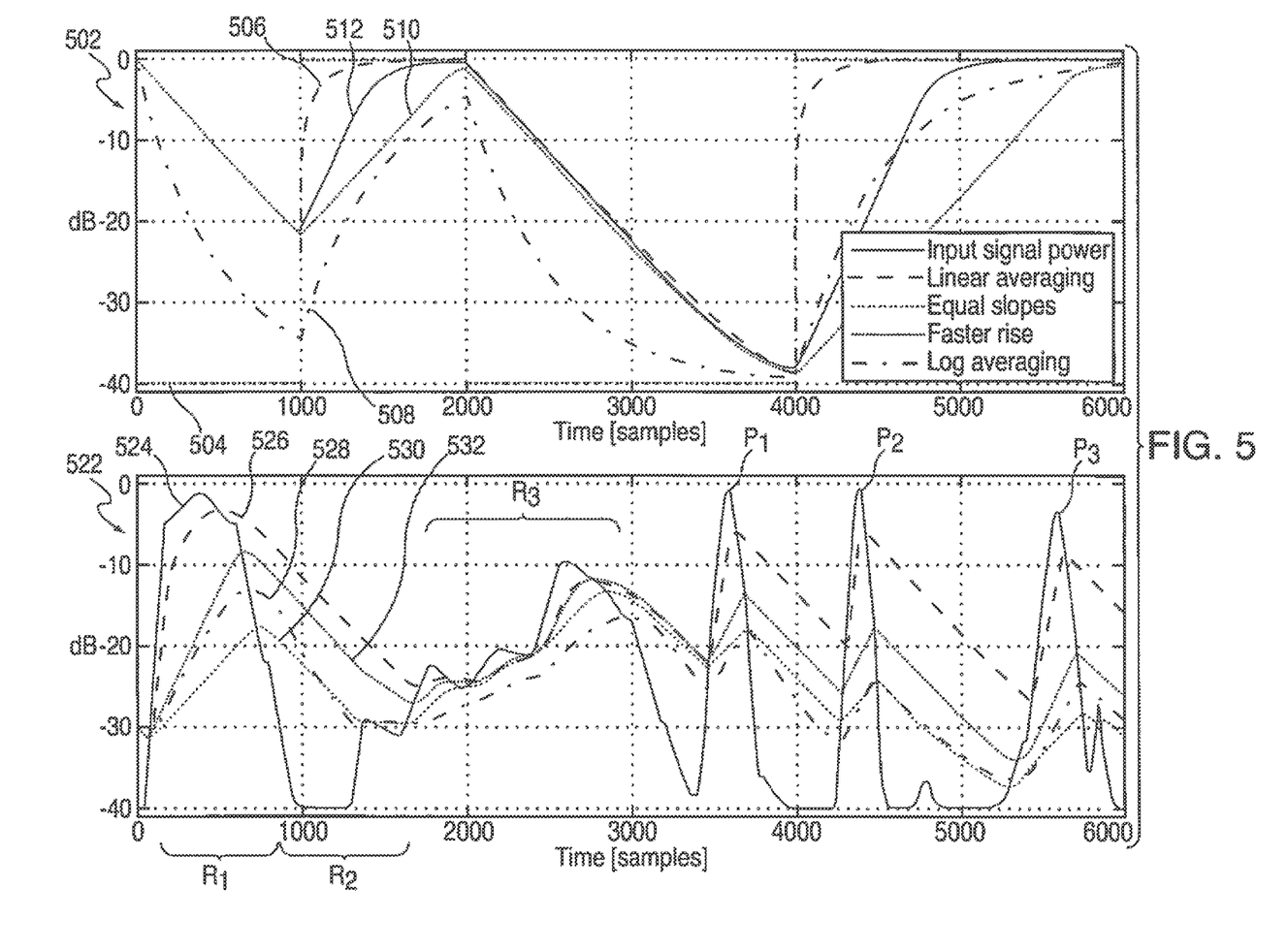
FIG. 5 shows illustrative graphs of input signal power level along with potential signal level estimation techniques in accordance with various embodiments.

FIG. 5 shows illustrative graphs of input signal power level along with potential signal level estimation techniques in accordance with various embodiments. In particular, graph 502 depicts illustrative input signal power level 504 along with time-averaged estimates 506, 508, 510, and 512, and graph 522 depicts illustrative input signal power 524 along with time-averaged estimates 526, 528, 530, and 532.

Graph 502 illustrates how different time-averaging processes may respond to step function input. As shown, input signal power 504 exhibits a series of step transitions between 0 dB and −40 dB (e.g., at time=0, time=1000, time=2000, and time=4000). Between each step transition, input signal power 504 holds a constant value (e.g., either +0 dB or −40 dB). Signal power estimates 506, 508, 510, and 512 can demonstrate how different time-averaging processes estimate the power level of input signal power 504 and result in rise and fall rates that may be linear, nonlinear, and/or linear on a logarithmic scale.

Signal power estimate 506 may be constructed using a linear combination of current and past samples of input signal power 504 according to:

$$y(k) = \alpha y(k-1) + (1-\alpha)x(k) \quad (6)$$

where x(k) is the current input sample of input signal power 504, y(k) is the current output of signal power estimate 506, and α is a coefficient selected to achieve a desired time constant (e.g., α may be selected to produce a desired weighting function similar to those described with respect to FIG. 4). As shown in graph 502, signal power estimate 506 may exhibit substantially faster rise rates than signal power estimates 508, 510, and 512 (see, e.g., time ranges [1000, 2000] and [4000, 6000]). The rise rate of signal power estimate 506 may be non-linear and approach input signal power 504 in an asymptotic manner. Additionally, signal power estimate 506 may exhibit substantially linear fall rates in response to step transitions (see, e.g., time ranges [0, 1000] and [2000, 4000]).

For comparison, signal power estimate 508 may be constructed using a non-linear combination of current and past samples of input signal power 504 according to:

$$y_{dB}(k) = \alpha_{dB} y_{dB}(k-1) + 10(1-\alpha_{dB})\log_{10}(x(k)) \quad (7)$$

where x(k) is the current input sample of input signal power 504, $y_{dB}(k)$ is the current output of signal power estimate 506, and $\alpha_{dB}$ is a coefficient selected to achieve a desired time constant (e.g., $\alpha_{dB}$ may be selected to produce a desired weighting function similar to those described with respect to FIG. 4). One skilled in the art will appreciate that $\alpha_{dB}$ may need to have a different value as compared to α from Eq. (5) in order for the estimates to behave comparably. As shown in graph 502, signal power estimate 508 may exhibit substantially faster fall rates than signal power estimates 506, 510, and 512 (see, e.g., time ranges [0, 1000] and [2000, 4000]). The fall rate of signal power estimate 508 may be non-linear and approach input signal power 504 in an exponential manner. Additionally, signal power estimate 508 may exhibit exponentially-shaped rise rates in response to step transitions (see, e.g., time ranges [1000, 2000] and [4000, 6000]). The rise rate of signal power estimate 508 may be slower than signal power estimate 506, but faster than signal power estimate 510. Furthermore, as compared to other estimation methods, the rise and fall rates of signal power estimate 508 may be more dependent upon the magnitude of changes in the input signal.

In some embodiments, it may be desirable for power estimates to have rise and fall rates that are linear and/or equal. For example, in audio-based applications, due to how sound is perceived by the human ear, it may be desirable to have power estimates with linear rise and fall rates on a log scale. Accordingly, one potential implementation of power estimation may use a technique similar to Eq. (5), but the rise rate may be adjusted to produce substantially linear behavior. Such an implementation may be represented as:

$$y(k) = \alpha y(k-1) + (1-\alpha)x(k) \quad (8)$$
$$\text{if } y(k) > \frac{1}{\alpha} \cdot y(k-1), y(k) = \frac{1}{\alpha} \cdot y(k-1)$$

where x(k) is the current input sample of input signal power 504, y(k) is the current output of signal power estimate 510, and α is a coefficient selected to achieve a desired time constant (e.g., α may be selected to produce a desired weighting function similar to those described with respect to FIG. 4). As shown in graph 502, using this implementation results in signal power estimate 510, which may exhibit substantially linear rise and fall rates with substantially equal slopes (see, e.g., time ranges [1000, 2000] and [2000, 4000]).

In some embodiments, it may be desirable for power estimates to be more responsive to rises in an input signal power while still retaining substantially linear behavior. Accordingly, one potential implementation of power estimation may use a technique similar to Eqs. (5) and (7), but the rise rate may be adjusted to produce a faster rise rate as compared to Eq. (7). Such an implementation may be represented as:

$$y(k) = \alpha y(k-1) + (1-\alpha)x(k) \quad (9)$$
$$\text{if } y(k) > \frac{1}{\alpha^2} \cdot y(k-1), y(k) = \frac{1}{\alpha^2} \cdot y(k-1)$$

where x(k) is the current input sample of input signal power 504, y(k) is the current output of signal power estimate 512, and α is a coefficient selected to achieve a desired time constant (e.g., α may be selected to produce a desired weighting function similar to those described with respect to FIG. 4). As shown in graph 502, using this implementation results in signal power estimate 512, which may exhibit a substantially linear rise rate with a greater slope than signal power estimate 510 (see, e.g., time range [2000, 4000]).

Referring now to graph 522 of FIG. 5, illustrative input signal power 524 along with time-averaged estimates 526, 528, 530, and 532 of signal power 524 are shown. Input signal power 524 illustrates random power level changes and peaks, and may be representative of the power level of an input signal in accordance with various embodiments of this invention. Signal power estimate 526 may be calculated using the process described above with respect to signal power estimate 506. Similarly, signal power estimates 528, 530, and 532 may be calculated using the processes described above in regards to signal power estimates 508, 510, and 512, respectively.

The time-averaging process selected to estimate input signal power 524 may depend at least in part on characteristics of input signal power 524. These characteristics may include, but are not limited to, rise time, fall time, amplitude, variance, and/or signal shape of input signal power 524. For example, during interval R1, input signal power 524 rises relatively quickly from −40 dB to approximately +0 dB and then falls back to −40 dB near the end of interval R1. Signal power estimate 526 follows the rise of input signal power 524 well, however, during interval R2, signal power estimate 526 remains biased above input signal power 524 by a significant amount. In comparison, signal power estimate 530 does not track the rise of input signal power 524 as well as signal power estimate 526, but during interval R2, signal power estimate 530 is biased above input signal power 524 by a lesser amount compared to signal power estimate 526. For further comparison, signal power estimates 528 and 532 exhibit behavior between signal power estimates 526 and 530 in terms of tracking the rise and fall of input signal power 524 over intervals R1 and R2. Thus, when choosing a desired process for estimating input signal power 524, responsiveness to rises and subsequent falls in input power signal 524 may be considered.

As another example, during interval R3, input signal power 524 exhibits a general increase in power with a few peaks. Compared to signal power estimates 526, 530, and 532, signal power estimate 528 lags input signal power 524 by a greater amount and tends to underestimate the level of input signal power 524. Thus, when choosing a desired process for estimating input signal power 524, underestimation of input power level may be considered.

As yet another example, input signal power 524 exhibits several abrupt peaks of relatively short duration (e.g., peaks P1, P2, and P3). Signal power estimate 526 responds well to the rise in power corresponding to each of peaks P1, P2, and P3. However, signal power estimate 526 remains biased above input signal power 524 by a significant amount following each of the peaks. In comparison, signal power estimate 530 does not respond as quickly to the peaks, but following the peaks, signal power estimate 530 is biased above input signal power 524 by a lesser amount compared to signal power estimate 526. In some embodiments, it may be desirable for the signal power estimate to rise quickly in response to the peaks. In other embodiments, it may be desirable for the signal power estimate to respond more gradually to the peaks in order to limit sudden jumps and overall positive bias in the signal power estimate. Thus, the amount, magnitude, and/or number of changes anticipated in input signal power 524 may be considered when choosing a desired process for estimating input signal power 524.

Figure 6:
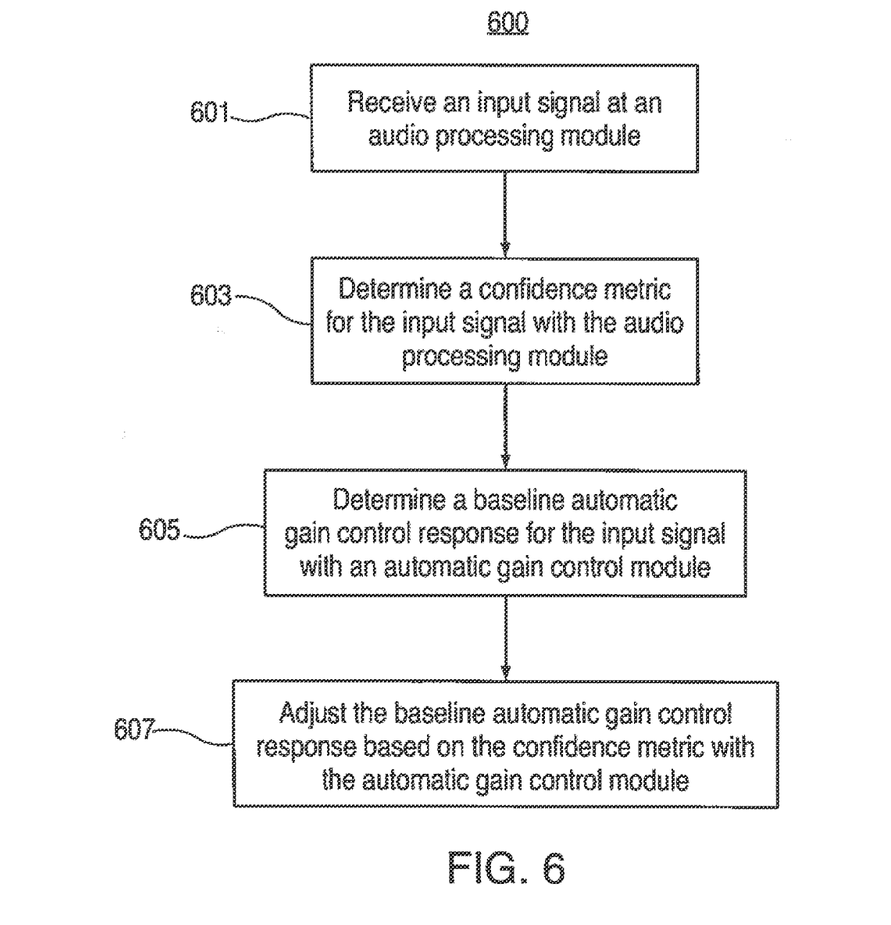
FIG. 6 is a flowchart of an illustrative process for adjusting automatic gain control in accordance with some embodiments.

FIG. 6 is a flowchart of an illustrative process 600 for adjusting automatic gain control in accordance with some embodiments. At step 601, an input signal can be received at an audio processing module. The audio processing module may be audio processing module 104 of FIG. 1. The input signal may be received from any suitable source including, an input device such as a microphone or an audio reproduction device such as a CD player, MP3 player, phonograph player, for example. The audio processing module can include any number of analog or digital audio processing modules for altering the input signal. Such audio processing modules can include pre-amplifiers, filters, equalizers, and noise cancellers, for example.

At step 603, the audio processing module can determine a confidence metric for the input signal. The confidence metric can represent the confidence that an AGC module will correctly adjust the gain of a given input signal. Thus, in some embodiments, the confidence metric may represent a moving average of individual confidence factors calculated for the input signal. An individual confidence factor can represent the validity of a particular chunk of the input signal by comparing a sum of valid samples of a weighting function for the given chunk of the input signal with a sum of all possible samples of the weighting function. Accordingly, a chunk of the input signal with a high percentage of valid samples will have a higher confidence factor than a chunk of the input signal with a low percentage of valid samples.

The validity of a particular sample may be determined by comparing the average energy for the sample against one or more baseline energy values. For example, one baseline energy value may represent a multiple of the background noise of the input signal such that samples exceeding the baseline energy value may be recognized as valid, whereas samples falling below the baseline energy value may be recognized as invalid. In some embodiments, the validity of a particular sample may be determined by a level-based activity detector, which may be a component of an audio processing module (e.g., audio processing module 104 of FIG. 1). The confidence metric may then be passed along with the processed input signal to the AGC module over one or more communications channels. According to some embodiments, the confidence metric may be sent over a first communications channel (e.g., AGC signal channel 116 of FIG. 1) and the processed input signal may be sent over a second communications channel (e.g., processed signal channel 114 of FIG. 1). In other embodiments, the confidence metric and processed input signals may be sent over the same communications channel.

At step 605, a baseline automatic gain control response for the received processed input signal can be determined by an AGC module. The baseline automatic gain response may be determined using one or more time-averaging processes as disclosed above with respect to FIG. 5. In general, as power level of the processed input signal increases, the AGC module can decrease the gain of the output signal and vice versa. Accordingly, the power of the signal output from the AGC module can be kept at an appropriate level.

Linear and/or nonlinear time-averaging processes can be used to obtain an estimate of the input signal power level. Depending on the application, power estimates calculated by the one or more time-averaging functions may reproduce the power level of the input signal to a greater or lesser extent. For instance, if the input signal contains sharp peaks or power surges, a time-averaging process with a relatively slow response may aid in peak suppression and a more appropriate AGC response. On the other hand, if peak suppression is not a priority, an aggressive time-averaging process may result in a more faithful reproduction of the input signal.

At step 607, the automatic gain control module can adjust the baseline automatic gain response based on the confidence metric. In general, when the confidence metric is relatively high, the AGC module may fully or substantially implement the baseline automatic gain response determined at step 605. On the other hand, when the confidence metric is relatively low, the AGC module may implement the automatic gain response determined at step 605 to a lesser extent.

According to some embodiments, the confidence factor may be compared to one or more threshold values (e.g., low confidence threshold 320 and high confidence threshold 330 of FIG. 3). For example, as described above with respect to FIG. 3, if the confidence factor exceeds the high threshold, the baseline automatic gain control response determined at step 605 may be fully implemented for the processed input signal. If the confidence factor fails to surpass the low threshold, the baseline automatic gains control response may not be implemented at all. If the confidence factor falls between the low and high thresholds, the baseline automatic gain response may be partially implemented.

According to some embodiments, the automatic gain control module may include a "dead zone," which can allow for a predetermined level of flexibility in the estimated power of the input signal without adjusting the gain of the signal, regardless of the confidence metric. For example, the automatic gain control module may only begin to adjust the gain as disclosed herein when the estimated power of the input signal exceeds an upper or lower threshold value.

The automatic gain control module may also employ hysteresis to prevent continuous gain adjustments when the estimated power of the input signal reaches a particular threshold. Thus, if the estimated power exceeds a particular high threshold level that results in a change in the gain of the input signal, the automatic gain control module may require that the estimated power of the input signal decrease to a level lower than that particular threshold before decreasing the gain of the input signal again. The same may apply, mutatis mutandis, to estimated power decreasing between a particular low threshold level.

One skilled in the art will appreciate that the AGC module can compare the confidence factor to any suitable number of threshold values, and the implementation of the baseline automatic gain response may vary accordingly at each threshold level. Implementation of the baseline automatic gain response may also vary continuously as a function of the confidence factor over the valid range of confidence factor values. For example, implementation of the baseline automatic gain response may vary linearly from 0% to 100% as the confidence factor varies from 0 to 1.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

Moreover, the systems and methods described herein may each be implemented by software, but may also be implemented in hardware, firmware, or any combination of software, hardware, and firmware. They each may also be embodied as machine-readable code recorded on a machine-readable medium. The machine-readable medium may be any data storage device that can store data that can thereafter be read by a computer system. Examples of the machine-readable medium may include, but are not limited to, read-only memory, random-access memory, flash memory, CD-ROMs, DVDs, magnetic tape, and optical data storage devices. The machine-readable medium can also be distributed over network-coupled computer systems so that the machine-readable code is stored and executed in distributed fashion.

What is claimed is:

1. A system for adjusting automatic gain control, the system comprising:
    an audio processing module configured to estimate a power level of an input signal, the audio processing module comprising hardware that is coupled to an automatic gain control module;
    the automatic gain control ("AGC") module comprises a processor coupled to a memory programmed with a plurality of power level estimation functions, and the AGC is configured to:
        receive and store in the memory a plurality of input signal samples;
        determine a characteristic of the input signal from the plurality of input signal samples, wherein the characteristic comprises one of: a rate of rise, a rate of fall, or a substantially steady state of the input signal samples;
        select a power level estimation function from the plurality of power level estimation functions based on the characteristic of the input signal;
        determine, and store in the memory, an estimated power level for at least one input signal sample, using the selected power level estimation function;
        determine an appropriate automatic gain response for the input signal based on the estimated power level.

2. The system of claim 1, further comprising an input device configured to generate the input signal and transmit the input signal to the audio processing module.

3. The system of claim 1, wherein the estimated power level comprises substantially linear rise and fall rates on a log scale in response to changes in the input signal.

4. The system of claim 1, wherein the estimated power level comprises nonlinear rise and fall rates on a log scale in response to changes in the input signal.

5. The system of claim 1, wherein the AGC module is configured to implement a baseline automatic gain control response comprising:
    an increase in the gain of the input signal in response to a lower estimated power level; and
    a decrease in the gain of the input signal in response to a higher estimated power level.

6. The system of claim 5, wherein the AGC module is further configured to adjust the baseline automatic gain control response as a function of a ratio of valid samples to invalid samples in the input signal.

7. The system of claim 6, wherein a valid sample comprises a sample with an average power exceeding a predetermined baseline energy value.

8. The system of claim 1, wherein, in response to determining that a rate of rise in the input signal samples is greater than a first threshold amount, the AGC selects the power level estimation function $y(k)=\alpha*y(k-1)+(1-\alpha)*x(k)$, and selects a value of $\alpha$ that weights $y(k-1)$ more heavily than $x(k)$, wherein k is a current input signal sample number, $x(k)$ is the current input signal sample, $y(k)$ is the current power level estimation function output, $y(k-1)$ is the power level estimation function output for a previous input signal sample $k-1$, and $\alpha$ is a tuning parameter in the range $0 \leq \alpha \leq 1$.

9. The system of claim 8, wherein, in response to determining that the characteristic of the input signal samples comprises a substantially steady state, selecting a value of value of $\alpha$ that weights $x(k)$ more heavily than $y(k-1)$.

10. The system of claim 8, wherein, in response to determining that a rate of rise in the input signal samples is greater than a second threshold amount, and that $$y(k) > \frac{1}{\alpha} * y(k-1), \text{ setting } y(k) = \frac{1}{\alpha} * y(k-1).$$

11. The system of claim 8, wherein, in response to determining that a rate of rise in the input signal samples is greater than a third threshold amount, and that $$y(k) > \frac{1}{\alpha^2} * y(k-1), \text{ setting } y(k) = \frac{1}{\alpha^2} * y(k-1).$$

12. The system of claim 1, wherein, in response to determining that a rate of fall in the input signal samples is greater than a fourth threshold amount, the AGC selects the power level emtimation function $y_{dB}(k) = \alpha_{dB} * y_{dB}(k-1) + 10 * (1-\alpha_{dB}) * \log_{10} x(k)$, and selects a coefficient $\alpha_{dB}$ for a specified time constant, wherein k is a current input signal sample number, x(k) is the current input signal sample, and $y_{dB}(k)$ is the current power level estimation function output, $y_{dB}(k-1)$ is the power level estimation function output for a previous input signal sample k−1.

* * * * *